(12) United States Patent
Nakamura et al.

(10) Patent No.: US 10,277,261 B2
(45) Date of Patent: Apr. 30, 2019

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventors: Tomohiro Nakamura, Kawasaki (JP); Takanori Iwamatsu, Nasushiobara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/991,381

(22) Filed: May 29, 2018

(65) Prior Publication Data

US 2018/0367174 A1    Dec. 20, 2018

(30) Foreign Application Priority Data

Jun. 20, 2017   (JP) .................................. 2017-120760

(51) Int. Cl.
  *H01L 29/20*       (2006.01)
  *H04B 1/04*        (2006.01)

(52) U.S. Cl.
  CPC ......... *H04B 1/0475* (2013.01); *H04B 1/0458* (2013.01); *H01L 29/2003* (2013.01); *H04B 2001/045* (2013.01); *H04B 2001/0425* (2013.01); *H04B 2001/0433* (2013.01)

(58) Field of Classification Search
  USPC ....................................................... 375/296
  See application file for complete search history.

(56) References Cited

U.S. PATENT DOCUMENTS

| | | | | |
|---|---|---|---|---|
| 7,944,295 B2 * | 5/2011 | Hongo | ................. | H03F 1/3247 330/149 |
| 2003/0228856 A1 | 12/2003 | Orihashi et al. | | |
| 2005/0104758 A1 * | 5/2005 | Funyu | ................. | H03F 1/3247 341/139 |
| 2005/0226346 A1 * | 10/2005 | Ode | ...................... | H03F 1/3247 375/296 |
| 2010/0271124 A1 * | 10/2010 | Lozhkin | ............... | H03F 1/3247 330/149 |

(Continued)

FOREIGN PATENT DOCUMENTS

| | | |
|---|---|---|
| JP | 2003-304122 | 10/2003 |
| JP | 2016-510551 | 4/2016 |

(Continued)

*Primary Examiner* — Eva Y Puente
(74) *Attorney, Agent, or Firm* — Fujitsu Patent Center

(57) ABSTRACT

A distortion compensation apparatus includes: a filtering unit that is provided with a plurality of storing units each of which is capable of storing a signal therein and that filters an input signal by sequentially moving the input signal starting from a storing unit provided on a first stage up to another storing unit provided on a final stage; a calculating unit that calculates a power level of a signal output from a storing unit that is provided on an earlier stage than the storing unit provided on the final stage; an output unit that, on the basis of the power level calculated, outputs a distortion compensation coefficient used for cancelling out non-linear distortion occurring in an amplifier; and a distortion compensation unit that performs a distortion compensation process on a signal output from the storing unit provided on the final stage, by using the distortion compensation coefficient.

6 Claims, 5 Drawing Sheets

(56) References Cited

U.S. PATENT DOCUMENTS

| | | |
|---|---|---|
| 2015/0236655 A1 | 8/2015 | Hirose et al. |
| 2015/0341868 A1 | 11/2015 | Cao et al. |
| 2018/0115332 A1* | 4/2018 | Kishibe ................ H03F 1/3247 |
| 2018/0167093 A1* | 6/2018 | Miyazaki .............. H03F 1/3247 |

FOREIGN PATENT DOCUMENTS

| | | |
|---|---|---|
| WO | 2014050218 | 4/2014 |
| WO | 2014117540 | 8/2014 |

* cited by examiner

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2017-120760, filed on Jun. 20, 2017, the entire contents of which are incorporated herein by reference.

FIELD

The embodiments discussed herein are related to a distortion compensation apparatus and a distortion compensation method.

BACKGROUND

In wireless communication systems of recent years, in particular, mobile communication systems of the third generation or later, a distortion compensation process may be performed by implementing a Digital PreDistortion (DPD) scheme, for the purpose of improving power efficiency of amplifiers provided in wireless communication apparatuses. Further, for example, also in multiplex wireless communication systems in which wireless communication is used in the trunk network thereof, a DPD scheme may be applied to wireless communication apparatuses provided at various types of communication stations.

The DPD scheme is a technique used for cancelling non-linear distortion occurring in an amplifier, by applying in advance, to a transmission signal, distortion having a characteristic inverse to the characteristic of the non-linear distortion occurring in the amplifier and causing the amplifier to amplify the transmission signal. The DPD scheme can be a factor that determines a maximum transmission power level of each wireless communication apparatus. As a result, the DPD scheme can have an impact on cell coverages of the wireless communication apparatuses.

Generally speaking, as a method for realizing the DPD scheme, a LookUp Table (LUT) method is known by which a lookup table is used for storing therein mutually-different distortion compensation coefficients in correspondence with power levels of transmission signals. The distortion compensation coefficients stored in the LUT correspond to characteristics that are inverse to the characteristics of non-linear distortion occurring in amplifiers. Accordingly, by reading, from the LUT, one of the distortion compensation coefficients corresponding to the power level of a transmission signal and multiplying the pre-amplification transmission signal by the read coefficient, it is possible to compensate the non-linear distortion occurring in the transmission signal at the amplifier.

Patent Literature 1: Japanese National Publication of International Patent Application No. 2016-510551
Patent Literature 2: International Publication Pamphlet No. WO 2014/050218
Patent literature 3: Japanese Laid-open Patent Publication No. 2003-304122

However, the DPD scheme using the LUT method has a problem where there is a long delay period before the distortion compensation coefficient is read from the LUT, and the communication is thus delayed.

More specifically, because the LUT has stored therein the distortion compensation coefficients in correspondence with the power levels of transmission signals, in order to read an appropriate distortion compensation coefficient, the power level of each transmission signal is calculated, and an address in the LUT is determined on the basis of the power level. After that, a distortion compensation coefficient is read from the determined address so as to multiply the transmission signal thereby. Accordingly, because the distortion compensation process for the transmission is not performed until the distortion compensation coefficient is read from the LUT, a delay occurs in the transmission signal prior to the amplification process.

In particular, in multiplex wireless communication systems, a long-distance transfer may be realized by using one or more relay stations. When a distortion compensation process using the DPD scheme is also performed in the wireless communication apparatuses provided at the relay stations, delays are accumulated before the signal reaches the final receiving station. For this reason, to keep the delay period shorter than a tolerated length, the number of relay stations provided on the way to the receiving station is limited, which makes it difficult to realize a sufficiently long transfer distance.

Further, for example, when a multiplex wireless communication system is used for an application requiring a real-time response such as that used for maintenance of an electric power transmission facility or for a system in a stock brokerage company, it is desirable to reduce the delay in the entire system by reducing the delay in the communication.

SUMMARY

According to an aspect of an embodiment, a distortion compensation apparatus includes: a filtering unit that is provided with a plurality of storing units each of which is capable of storing a signal therein and that filters an input signal by sequentially moving the input signal starting from a storing unit provided on a first stage up to another storing unit provided on a final stage; a calculating unit that calculates a power level of a signal output from a storing unit that is among the plurality of storing units in the filtering unit and is provided on an earlier stage than the storing unit provided on the final stage; an output unit that, on the basis of the power level calculated by the calculating unit, outputs a distortion compensation coefficient used for cancelling out non-linear distortion occurring in an amplifier during a signal amplifying process; and a distortion compensation unit that performs a distortion compensation process on a signal output from the storing unit provided on the final stage in the filtering unit, by using the distortion compensation coefficient output from the output unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present disclosure is not limited by the embodiments described below.

[a] First Embodiment

Figure 1:
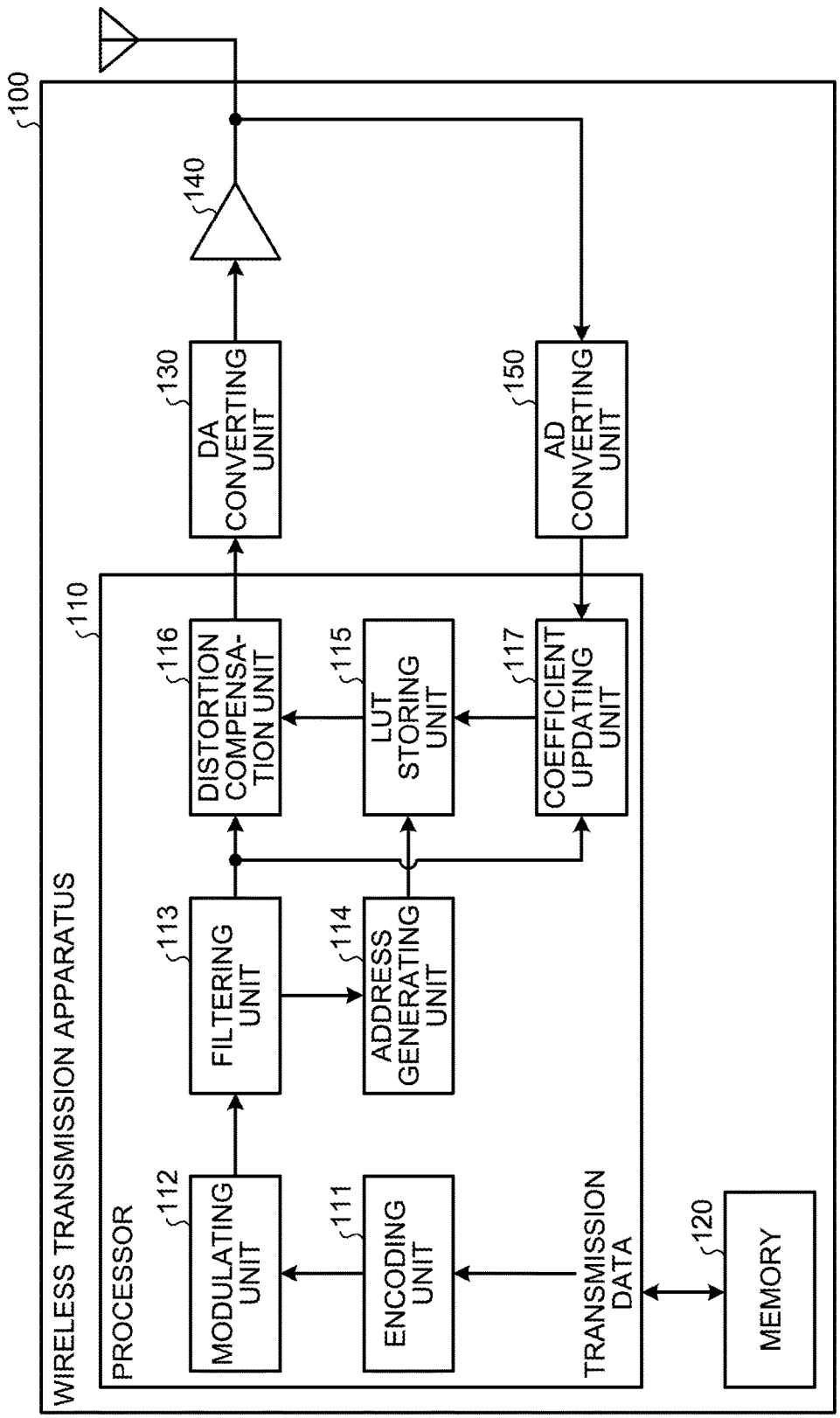
FIG. 1 is a block diagram illustrating a configuration of a wireless transmission apparatus according to a first embodiment.

FIG. 1 is a block diagram illustrating a configuration of a wireless transmission apparatus 100 according to a first embodiment. The wireless transmission apparatus 100 illustrated in FIG. 1 includes a processor 110, a memory 120, a Digital Analog (DA) converting unit 130, an amplifier 140, and an Analog Digital (AD) converting unit 150.

The processor 110 includes, for example, a Central Processing Unit (CPU), a Field Programmable Gate Array (FPGA), or any of various types of Large Scale Integration (LSI) circuits and is configured to control the entirety of the wireless transmission apparatus 100. More specifically, the processor 110 includes an encoding unit 111, a modulating unit 112, a filtering unit 113, an address generating unit 114, a LookUp Table (LUT) storing unit 115, a distortion compensation unit 116, and a coefficient updating unit 117.

The encoding unit 111 performs an encoding process by appending an error correction code or the like to transmission data and outputs the obtained encoded data to the modulating unit 112.

The modulating unit 112 modulates the encoded data by using a modulation method such as a 128 Quadrature Amplitude Modulation method, for example, and outputs the obtained modulated signal including an In-phase (I) signal and a Quadrature (Q) signal to the filtering unit 113.

By performing a filtering process that passes a predetermined frequency band component of the modulated signal, the filtering unit 113 eliminates an unnecessary band component included in the modulated signal. More specifically, the filtering unit 113 has a multi-stage flip-flop structure including a plurality of flip-flop elements and is configured to filter the modulated signal by performing a calculation between samples that are earlier and later on a time axis, while sequentially storing the samples of the input modulated signal in the flip-flop elements. Accordingly, this configuration is structured in such a manner that the filtering unit 113 causes delays corresponding to the number of flip-flop elements to the modulated signal. As the filtering unit 113, for example, a 64-tap low-pass filter may be used.

The address generating unit 114 calculates the power level of the modulated signal filtered by the filtering unit 113 and generates the address in the LUT at which a distortion compensation coefficient is stored on the basis of the calculated power level. More specifically, the address generating unit 114 calculates the power level of the modulated signal from the I signal and the Q signal included in the modulated signal and obtains the address corresponding to the power level of the modulated signal. In this situation, the address generating unit 114 calculates the power level by using the modulated signal output from a flip-flop element that is among the plurality of flip-flop elements included in the filtering unit 113 and is on an earlier stage than the flip-flop element provided on the final stage. In other words, while the modulated signal is sequentially moving through the plurality of flip-flop elements, the address generating unit 114 obtains the modulated signal from one of the flip-flop elements somewhere in the middle of the route and uses the obtained modulated signal for calculating the power level. For this reason, the address generating unit 114 starts calculating the power level, before the modulated signal that has been filtered is eventually output from the filtering unit 113.

The LUT storing unit 115 has stored therein the LUT in which a distortion compensation coefficient is stored at each of a plurality of addresses. When the address generating unit 114 has generated the address, the distortion compensation coefficient stored at the generated address is output to the distortion compensation unit 116. The distortion compensation coefficients stored in the LUT each have a characteristic inverse to the characteristic of the non-linear distortion caused by the amplifier 140. The distortion compensation coefficients vary depending on the power levels of signals.

The distortion compensation unit 116 performs a distortion compensation process on the modulated signal, by multiplying the modulated signal output from the filtering unit 113 by the distortion compensation coefficient output from the LUT storing unit 115. In other words, the distortion compensation unit 116 applies distortion having the characteristic inverse to the characteristic of the non-linear distortion occurring in the amplifier 140, to the modulated signal which was output from the final-stage flip-flop element in the filtering unit 113 and from which the unnecessary band component has been eliminated. After that, the distortion compensation unit 116 outputs the transmission signal obtained by performing the distortion compensation process on the modulated signal, to the DA converting unit 130.

The coefficient updating unit 117 updates the distortion compensation coefficient stored in the LUT, by using the modulated signal output from the filtering unit 113 and the transmission signal amplified by the amplifier 140. More specifically, by using the modulated signal prior to the distortion compensation process performed by the distortion compensation unit 116 and a feedback signal that is fed back after the amplification performed by the amplifier 140, the coefficient updating unit 117 updates the distortion compensation coefficient stored in the LUT to make smaller the difference between the signal before the amplification and the signal after the amplification.

The memory 120 includes a Random Access Memory (RAM), a Read-Only memory (ROM), or the like, for example, and stores therein various types of information when processes are performed by the processor 110.

The DA converting unit 130 performs a DA conversion on the transmission signal output from the processor 110 and outputs the obtained analog transmission signal to the amplifier 140.

The amplifier 140 amplifies the transmission signal. The transmission signal amplified by the amplifier 140 is transmitted via an antenna. When the amplifier 140 amplifies the transmission signal, the non-linear distortion corresponding to the power level of the signal occurs; however, because the transmission signal is multiplied by the distortion compensation coefficient in advance, the non-linear distortion occurring in the amplifier 140 is cancelled out. As a result, the non-linear distortion of the transmission signal is reduced. It is therefore possible to inhibit emissions in adjacent bands.

The AD converting unit 150 receives the transmission signal amplified by the amplifier 140 as a feedback and performs an AD conversion on the feedback signal received as the feedback. After that, the AD converting unit 150 outputs the obtained digital feedback signal to the coefficient updating unit 117 included in the processor 110.

Figure 2:
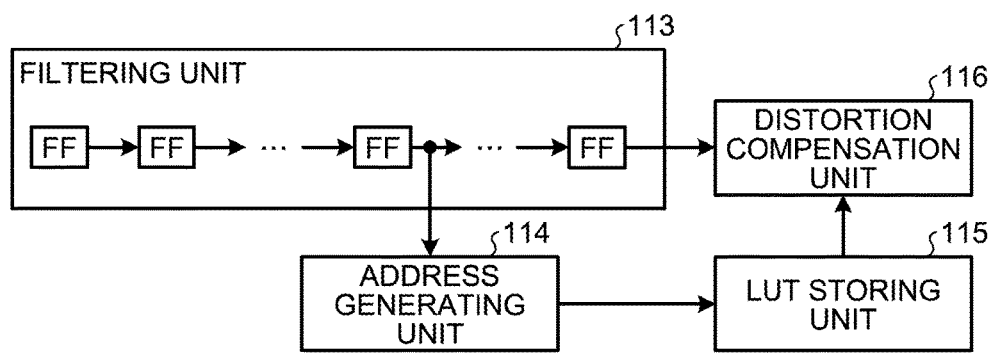
FIG. 2 is a block diagram illustrating a configuration of relevant parts of the wireless transmission apparatus according to the first embodiment.

FIG. 2 is a block diagram illustrating the processing units related to the distortion compensation process performed by the wireless transmission apparatus 100 according to the first embodiment.

As illustrated in FIG. 2, the filtering unit 113 includes the plurality of flip-flop elements (each indicated as "FF" in the drawing) each of which can store a signal therein. The filtering unit 113 filters the input modulated signal by sequentially moving the modulated signal, starting from the flip-flop element on the first stage up to the flip-flop element on the final stage (hereinafter, "final-stage flip-flop element"). Accordingly, when the filtering unit 113 is configured by using a 64-tap low-pass filter, for example, a delay corresponding to 64 cycles is caused on the modulated signal in the time period from the time when the modulated signal is input to the filtering unit 113 to the time when the modulated signal is output from the final-stage flip-flop element.

The distortion compensation unit 116 performs the distortion compensation process on the modulated signal output from the final-stage flip-flop element in the filtering unit 113. Further, the address generating unit 114 obtains the modulated signal output from one of the flip-flop elements on an earlier stage than the final-stage flip-flop element in the filtering unit 113 and calculates the power level of the obtained modulated signal. Accordingly, by using the modulated signal having a shorter delay, the address generating unit 114 starts generating the address, before the modulated signal is output from the final-stage flip-flop element. After that, before the modulated signal is output from the final-stage flip-flop element to the distortion compensation unit 116, the address generating unit 114 generates the address, so that the distortion compensation coefficient is output from the LUT storing unit 115. As a result, when the modulated signal is output from the filtering unit 113, the distortion compensation unit 116 is able to immediately perform the distortion compensation process on the modulated signal, without waiting for the distortion compensation coefficient to be output.

Figure 3:
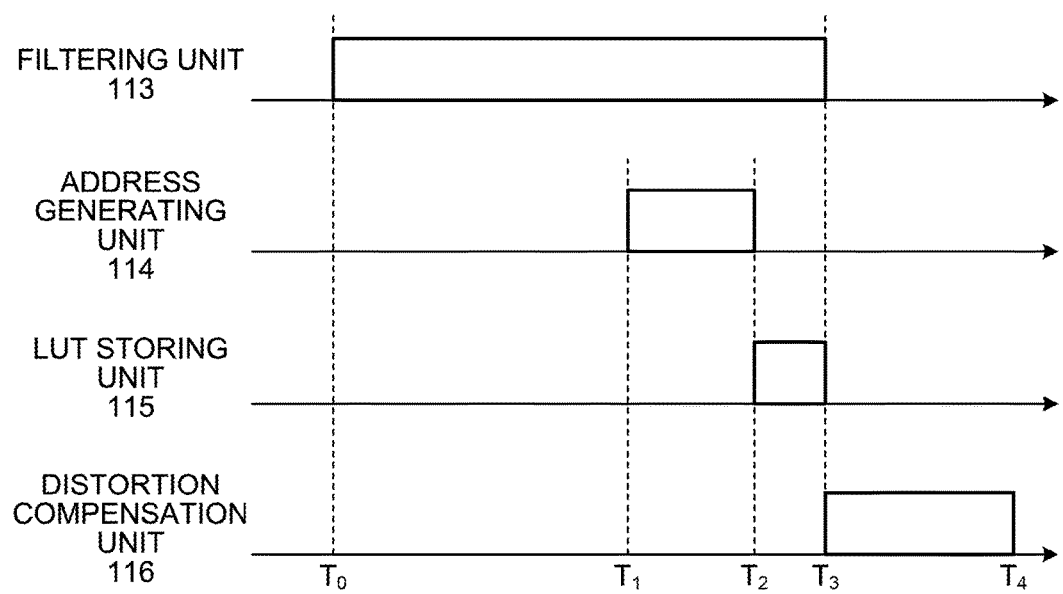
FIG. 3 is a drawing illustrating a specific example of a time chart indicating each process.

FIG. 3 is a drawing illustrating a specific example of a time chart indicating each of the processes performed by the processing units illustrated in FIG. 2.

When the modulated signal is input to the filtering unit 113 at a time $T_0$, the modulated signal sequentially moves through the flip-flop elements and is output to the distortion compensation unit 116 from the final-stage flip-flop element at a time $T_3$. In this situation, the address generating unit 114 obtains the modulated signal from the filtering unit 113 at the time $T_1$, which is earlier than the time $T_3$. Accordingly, the address generating unit 114 obtains the modulated signal from a flip-flop element that is on an earlier stage than the final-stage flip-flop element. After that, during the time period between the time $T_1$ and a time $T_2$, the address generating unit 114 calculates the power level of the modulated signal and generates the address in the LUT on the basis of the calculated power level.

When the address is generated, during the time period between the time $T_2$ and the time $T_3$, the LUT storing unit 115 reads the distortion compensation coefficient at the corresponding address from the LUT and outputs the read distortion compensation coefficient to the distortion compensation unit 116. As a result, at the time $T_3$, the distortion compensation unit 116 obtains the modulated signal output from the final-stage flip-flop element in the filtering unit 113 and the distortion compensation coefficient output from the LUT storing unit 115. Consequently, the distortion compensation unit 116 is able to perform the distortion compensation process of multiplying the modulated signal by the distortion compensation coefficient, during the time period between the time $T_3$ and the time $T_4$, without the need to wait for the distortion compensation coefficient to be output from the LUT storing unit 115.

In the manner described above, the address generating unit 114 starts generating the address by obtaining the modulated signal from the filtering unit 113 earlier by the length of time between the time $T_1$ and the time $T_3$, which corresponds to the processing time of the address generating unit 114 and the LUT storing unit 115. Accordingly, the distortion compensation unit 116 is able to perform the distortion compensation process by obtaining the distortion compensation coefficient at the same time as the modulated signal is output from the final-stage flip-flop element in the filtering unit 113. As a result, it is possible to reduce the delay caused by the distortion compensation process and to shorten the time period it takes before the transmission signal is transmitted. It is therefore possible to reduce the delay in the communication.

In this situation, because the address generating unit 114 obtains the modulated signal from the flip-flop element that is on the earlier stage than the final-stage flip-flop element in the filtering unit 113, the modulated signal used for generating the address is a signal different from the modulated signal on which the distortion compensation process is performed by the distortion compensation unit 116. In other words, the address generating unit 114 generates the address by using the modulated signal corresponding to the time earlier than when the filtering process performed by the filtering unit 113 is completed.

However, when the modulated signal is output from a flip-flop element within a predetermined range from the final-stage flip-flop element in the filtering unit 113, the difference in the power level between the output modulated signal and the modulated signal output from the final-stage flip-flop element is small. It is therefore possible to generate an address that is sufficiently accurate.

FIG. 4 is a drawing illustrating specific examples of relationships between the numbers of taps and filter characteristics. In other words, FIG. 4 illustrates, with respect to a modulated signal including a main signal component 201 and an unnecessary band component 202, a passband of the filtering unit 113 for each of the various numbers of taps.

Figure 4A:
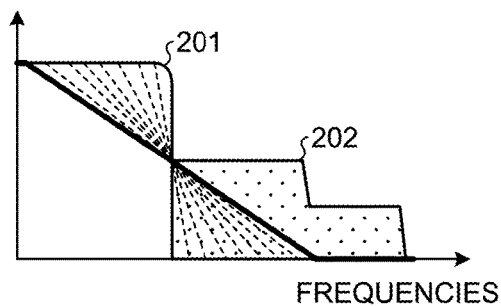
FIGS. 4A to 4H are drawings illustrating specific examples of relationships between the numbers of taps and filter characteristics.
Figure 4B:
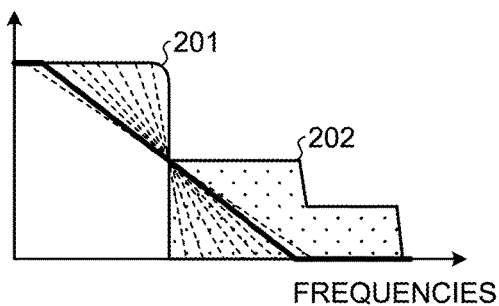
Figure 4C:
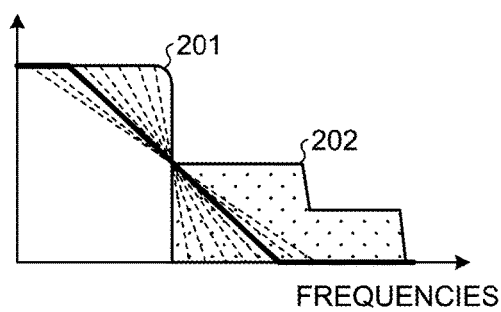
Figure 4D:
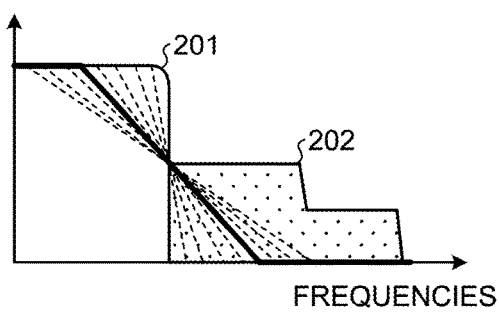
Figure 4E:
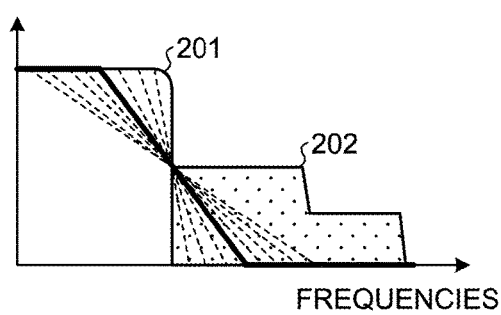
Figure 4F:
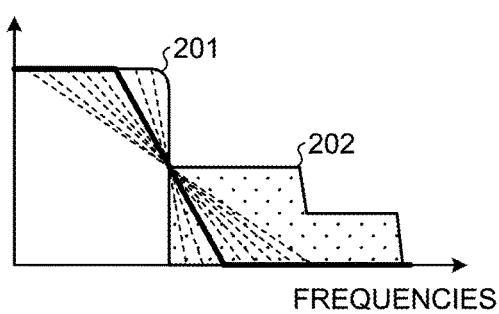

For example, FIG. 4A illustrates a passband corresponding to 8 taps with a solid line. FIG. 4B illustrates a passband corresponding to 16 taps with a solid line. FIG. 4C illustrates a passband corresponding to 24 taps with a solid line. Similarly, FIGS. 4D to 4H illustrate passbands corresponding to 32 taps, 40 taps, 48 taps, 56 taps, and 64 taps with solid lines, respectively. As observed in these drawings, by using 8 taps as illustrated in FIG. 4A, for example, much of the main signal component 201 is eliminated, and much of the unnecessary band component 202 is passed. For this reason, when the power level is calculated by obtaining the modulated signal from the flip-flop element corresponding to 8 taps, the calculated power level is significantly different from the power level of the modulated signal filtered with 64 taps corresponding to the final stage. As a result, when an address is generated from the modulated signal output from the flip-flop element corresponding to 8 taps, an inappropriate distortion compensation coefficient would be output from the LUT, which would lower the level of precision of the distortion compensation process.

Figure 4G:
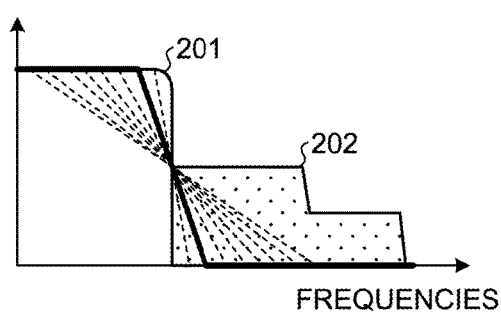
Figure 4H:
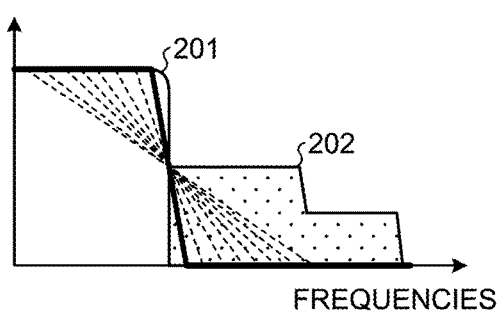

In contrast, as the number of taps increases from 16 taps (FIG. 4B), to 24 taps (FIG. 4C), 32 taps (FIG. 4D), and 40 taps (FIG. 4E), the main signal component 201 is eliminated less easily, and the unnecessary band component 202 is eliminated more. For this reason, when the final stage corresponds to 64 taps (FIG. 4H), for example, it is possible to generate an address that is sufficiently accurate, by calculating the power level while using the modulated signal filtered with 48 taps (FIG. 4F) or 56 taps (FIG. 4G). Accordingly, when an address is generated by obtaining the modulated signal from the flip-flop element corresponding to 56 taps, for example, it is possible to perform the distortion compensation process with a sufficiently high level of precision.

As explained above, according to at least one aspect of the present embodiment, the power level is calculated by using the modulated signal output from the flip-flop element that is on an earlier stage than the final stage of the filter used for filtering the modulated signal, so as to generate the address in the LUT at which the distortion compensation coefficient is stored. Accordingly, because the address generating process is started before the modulated signal is output from the final-stage flip-flop element in the filter, it is possible to arrange the distortion compensation coefficient to be output from the LUT earlier. As a result, it is possible to reduce the delay caused by the distortion compensation process performed on the modulated signal and to shorten the time period it takes before the transmission signal is transmitted. It is therefore possible to reduce the delay in the communication.

In the first embodiment described above, the example is explained in which the distortion compensation coefficient is output from the LUT storing unit 115 at the same time as the modulated signal is output from the final-stage flip-flop element in the filtering unit 113; however, the modulated signal and the distortion compensation coefficient do not need to be output at the same time as each other. To summarize, it is sufficient so long as the address generating unit 114 starts the address generating process by obtaining the modulated signal from the filtering unit 113 on a stage earlier to an extent that it is possible to generate an accurate address. With this arrangement, even when the distortion compensation coefficient has not yet been output at the point in time when the modulated signal is output from the final-stage flip-flop element in the filtering unit 113, it is possible to reduce the standby time period of the distortion compensation process performed by the distortion compensation unit 116.

Figure 5:
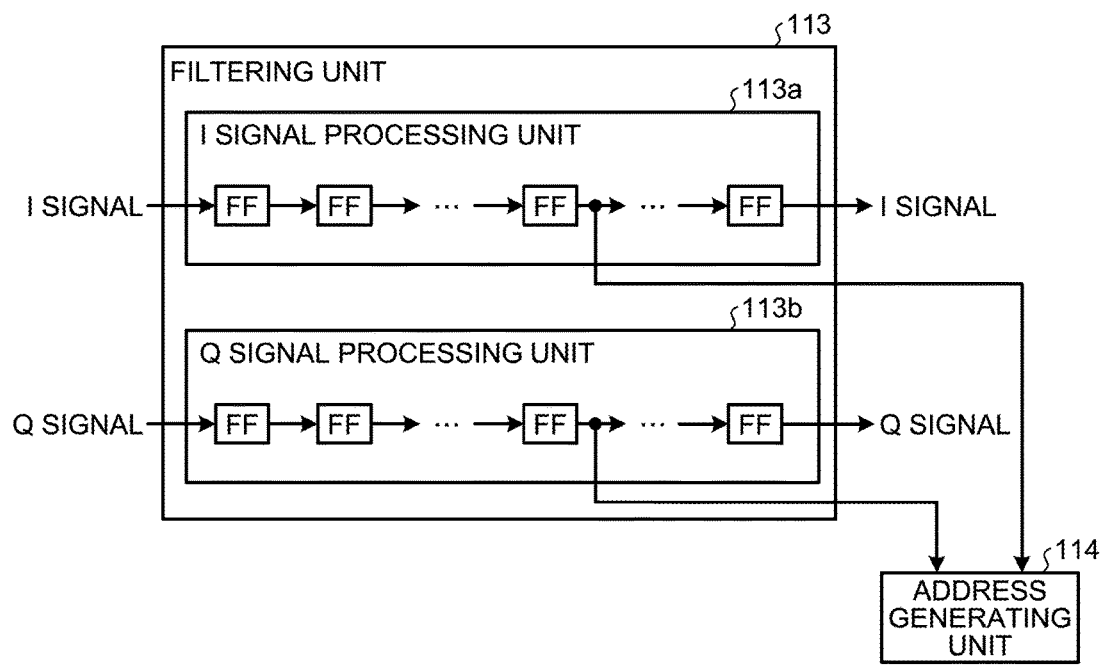
FIG. 5 is a diagram illustrating an exemplary configuration of a filtering unit.

Further, possible configurations of the filtering unit 113 are not limited to the example illustrated in FIG. 2. In other words, as illustrated in FIG. 5, for example, the filtering unit 113 may include an I signal processing unit 113a and a Q signal processing unit 113b.

The I signal processing unit 113a includes a plurality of flip-flop elements each of which can store a signal therein. By sequentially moving the I signal included in the modulated signal, starting from a flip-flop element on the first stage up to the flip-flop element on the final stage, the I signal processing unit 113a filters the I signal.

The Q signal processing unit 113b includes a plurality of flip-flop elements each of which can store a signal therein. By sequentially moving the Q signal included in the modulated signal, starting from a flip-flop element on the first stage up to the flip-flop element on the final stage, the Q signal processing unit 113b filters the Q signal.

The address generating unit 114 calculates the power level of the modulated signal, by obtaining the I signal and the Q signal from flip-flop elements that are each on an earlier stage than the final-stage flip-flop elements in the I signal processing unit 113a and the Q signal processing unit 113b. in this situation, the address generating unit 114 may obtain the I signal and the Q signal from flip-flop elements that are in mutually-different positions in the I signal processing unit 113a and the Q signal processing unit 113b.

As explained above, even when the I signal and the Q signal are filtered independently of each other in the filtering unit 113, it is possible to reduce the delay caused by the distortion compensation process, by calculating the power level of the modulated signal while using the I signal and the Q signal output from the flip-flop elements that are each on an earlier stage than the final stage.

[b] Second Embodiment

A characteristic of a second embodiment lies in that the position within the filter from which the modulated signal used for generating the address is extracted is selectively switched.

Because the configuration of the wireless transmission apparatus according to the second embodiment is the same as that of the wireless transmission apparatus 100 (FIG. 1) according to the first embodiment, the explanation thereof will be omitted. In the second embodiment, processing units related to the distortion compensation process are different from those in the first embodiment.

Figure 6:
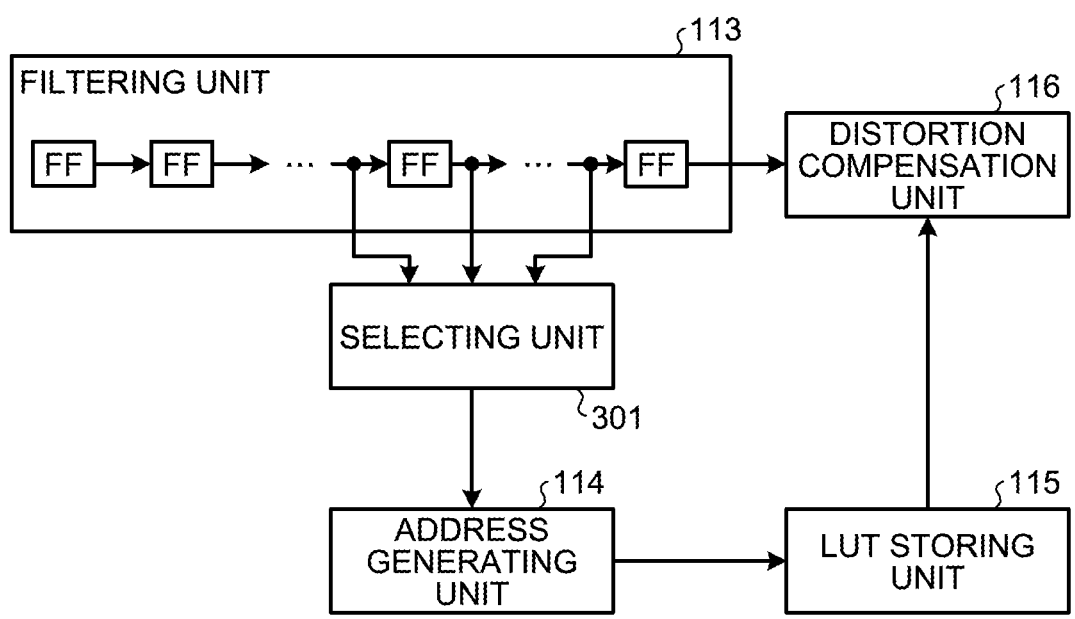
FIG. 6 is a block diagram illustrating a configuration of relevant parts of a wireless transmission apparatus according to the second embodiment.

FIG. 6 is a block diagram illustrating processing units related to a distortion compensation process performed by a wireless transmission apparatus according to the second embodiment. In FIG. 6, some of the constituent elements that are the same as those in FIG. 2 are referred to by using the same reference characters. As illustrated in FIG. 6, in the second embodiment, a selecting unit 301 is provided between the filtering unit 113 and the address generating unit 114.

From among the plurality of flip-flop elements included in the filtering unit 113, the selecting unit 301 selects one from among a predetermined number of flip-flop element that are on earlier stages than the final-stage flip-flop element and outputs the modulated signal output from the selected flip-flop element to the address generating unit 114. In other words, the selecting unit 301 determines a delay amount of the modulated signal to be used for calculating the power level and further outputs the modulated signal output from the flip-flop element corresponding to the determined delay amount, to the address generating unit 114.

In this situation, the selecting unit 301 may select the flip-flop element corresponding to the delay amount set by the user in accordance with a propagation delay amount tolerated in the system, for example, and may output the modulated signal output from the selected flip-flop element to the address generating unit 114. In another example, the selecting unit 301 may select a flip-flop element in accordance with the unnecessary band component included in the modulated signal input to the filtering unit 113, for example. In other words, the selecting unit 301 monitors the modulated signal input to the filtering unit 113 and measures the unnecessary band component included in the modulated signal. After that, the selecting unit 301 selects one of the flip-flop elements according to the measured result of the unnecessary band component. In that situation, the selecting unit 301 may select the flip-flop element in such a manner that the larger the unnecessary band component is, the later stage from which the flip-flop element is selected, so as to obtain, for the purpose of calculating the power level, the modulated signal from which more unnecessary band component is eliminated by the filtering unit 113.

In yet another example, the selecting unit 301 may select a flip-flop element corresponding to a distortion characteristic of the amplifier 140. In other words, the selecting unit 301 may select the flip-flop element in such a manner that the larger the non-linear distortion occurring in the amplifier 140 is, the later stage from which the flip-flop element is selected, so that the address generating unit 114 is able to generate an accurate address and so that the level of precision of the distortion compensation process is thus improved.

As explained above, according to at least one aspect of the present embodiment, the one flip-flop element is selected from among the predetermined number of flip-flop elements that are on the earlier stages than the final stage of the filter used for filtering the modulated signal. The modulated signal output from the selected flip-flop element is then used for generating the address. With this arrangement, it is possible to control the delay amount caused by the distortion compensation process and the level of precision of the distortion compensation process, depending on various situations.

By using the distortion compensation apparatus and the distortion compensation method according to at least one mode of the present disclosure, an advantageous effect is achieved where it is possible to reduce the delay in the communication.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
    a filtering unit that is provided with a plurality of storing units each of which is capable of storing a signal therein and that filters an input signal by sequentially moving the input signal starting from a storing unit provided on a first stage up to another storing unit provided on a final stage;
    a calculating unit that calculates a power level of a signal output from a storing unit that is among the plurality of storing units in the filtering unit and is provided on an earlier stage than the storing unit provided on the final stage;
    an output unit that, on the basis of the power level calculated by the calculating unit, outputs a distortion compensation coefficient used for cancelling out non-linear distortion occurring in an amplifier during a signal amplifying process; and
    a distortion compensation unit that performs a distortion compensation process on a signal output from the storing unit provided on the final stage in the filtering unit, by using the distortion compensation coefficient output from the output unit.

2. The distortion compensation apparatus according to claim 1, wherein
    the output unit includes a table that stores therein a distortion compensation coefficient in correspondence with each of various addresses corresponding to power levels of signals, and
    the output unit outputs, from the table, the distortion compensation coefficient stored at an address corresponding to the power level calculated by the calculating unit.

3. The distortion compensation apparatus according to claim 1, further comprising: a selecting unit that selects the storing unit that is among the plurality of storing units in the filtering unit and is provided on the earlier stage than the storing unit provided on the final stage, wherein
    the calculating unit calculates the power level of the signal output from the storing unit selected by the selecting unit.

4. The distortion compensation apparatus according to claim 3, wherein the selecting unit measures an unnecessary band component included in the input signal input to the filtering unit to select the storing unit in accordance with a result of the measuring.

5. The distortion compensation apparatus according to claim 3, wherein the selecting unit selects the storing unit in accordance with a characteristic of the amplifier.

6. A distortion compensation method implemented by a distortion compensation apparatus including a filtering unit that is provided with a plurality of storing units each of which is capable of storing a signal therein and that filters an input signal by sequentially moving the input signal starting from a storing unit provided on a first stage up to another storing unit provided on a final stage, the distortion compensation method comprising:
    calculating a power level of a signal output from a storing unit that is among the plurality of storing units in the filtering unit and is provided on an earlier stage than the storing unit provided on the final stage;
    determining, on the basis of the calculated power level, a distortion compensation coefficient used for cancelling out non-linear distortion occurring in an amplifier during a signal amplifying process; and
    performing a distortion compensation process on a signal output from the storing unit provided on the final stage in the filtering unit, by using the determined distortion compensation coefficient.

\* \* \* \* \*